(12) United States Patent
Shirahata et al.

(10) Patent No.: US 6,248,653 B1
(45) Date of Patent: Jun. 19, 2001

(54) METHOD OF MANUFACTURING GATE STRUCTURE

(75) Inventors: Masayoshi Shirahata; Masashi Kitazawa; Kazunobu Ota, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/537,409

(22) Filed: Mar. 29, 2000

(30) Foreign Application Priority Data

Oct. 28, 1999 (JP) .................................................. 11-306667

(51) Int. Cl.⁷ ............................................... H01L 21/3205
(52) U.S. Cl. ................................................................ 438/585
(58) Field of Search ..................................... 438/585, 586, 438/588, 589, 591, 592, 593, 595, 596, 645, 648, 691, 696

(56) References Cited

U.S. PATENT DOCUMENTS 5,594,264   1/1997   Shirahata et al. ................... 257/335
6,018,185 * 1/2000   Mitani et al. ........................ 257/374

FOREIGN PATENT DOCUMENTS 8-264531   10/1996   (JP) .
9-246543    9/1997   (JP) .

* cited by examiner

Primary Examiner—David Nelms
Assistant Examiner—Quoc Hoang
(74) Attorney, Agent, or Firm—Oblon, Spivak, McClelland, Maier & Neustadt, P.C.

(57) ABSTRACT

A method of manufacturing a gate structure is provided which enables to obtain a gate structure of a low resistance without increasing the height of the gate electrode, and therefore to suppress its height, by performing etching using a vapor phase hydrofluoric acid, thereby to selectively remove a TEOS oxide film (11) containing impurity at a predetermined concentration; and forming a metal film in the region surrounded by a TEOS oxide film (12) and polysilicon (3).

20 Claims, 9 Drawing Sheets

METHOD OF MANUFACTURING GATE STRUCTURE

BACKGROUND OF THE INVENTION

1. Field of the Invention

The present invention relates to a method of manufacturing a gate structure having a transistor, and particularly, to a gate electrode of a transistor.

2. Description of the Background Art

A conventional method of manufacturing a gate structure is described below by referring to FIGS. 11 to 16.

Figure 11:
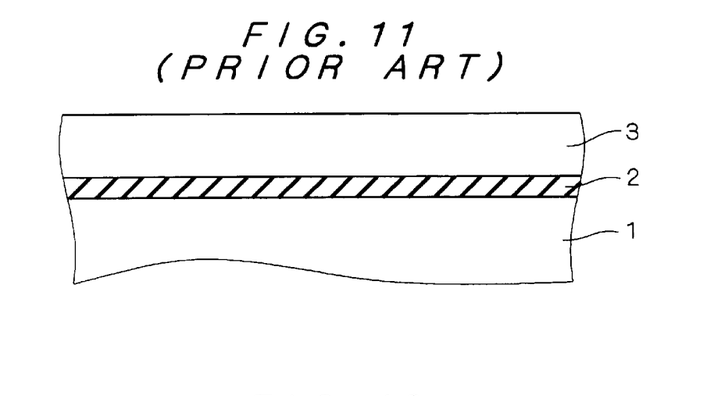
FIGS. 11 to 16 are cross sections illustrating a method of manufacturing a conventional gate structure.

Referring to FIG. 11, a gate oxide film 2 and polysilicon 3 are formed on a semiconductor substrate 1.

Figure 12:
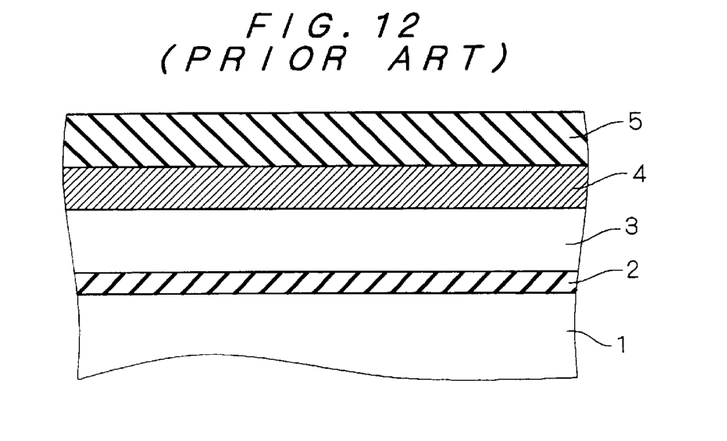

Referring to FIG. 12, masks (not shown) are applied to the regions where a Nch transistor and a Pch transistor will be formed respectively, followed by implantation of impurity. The impurity implanted to the polysilicon 3 is, for example, boron (B) in forming a Pch transistor, and phosphorus (P) in forming a Nch transistor. Then, a tungsten silicide (WSi) 4 is formed on the polysilicon 3, and a silicon nitride film (SiN) 5 is formed thereon, as an upper mask.

Figure 13:
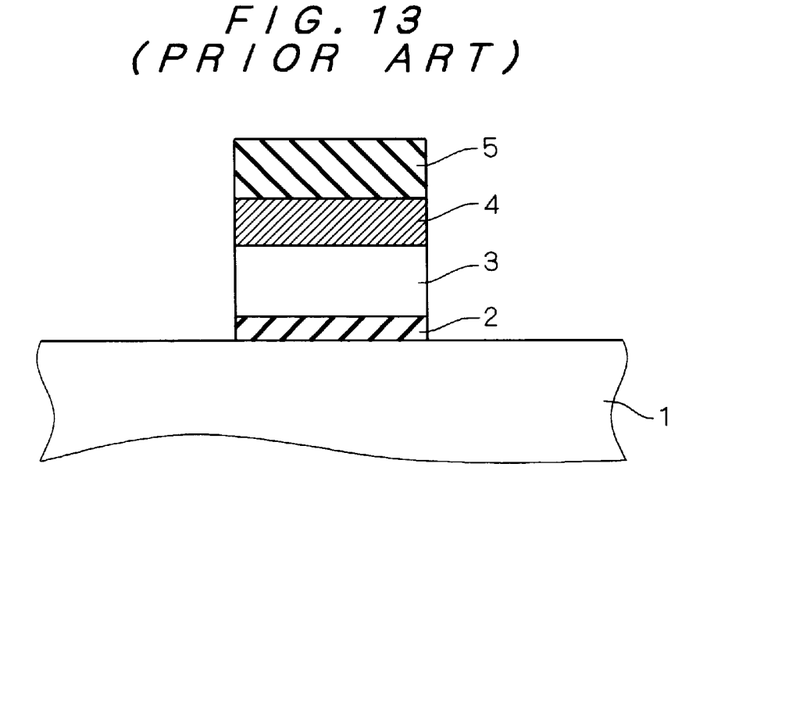

Referring to FIG. 13, a resist (not shown) is formed, and the resist is patterned by photolithography technique. By using the resultant resist as a mask, the silicon nitride film 5 is etched away. By using the remaining silicon nitride film 5 as a mask, the gate oxide film 2, polysilicon 3 and tungsten silicide 4 are etched away.

Figure 14:
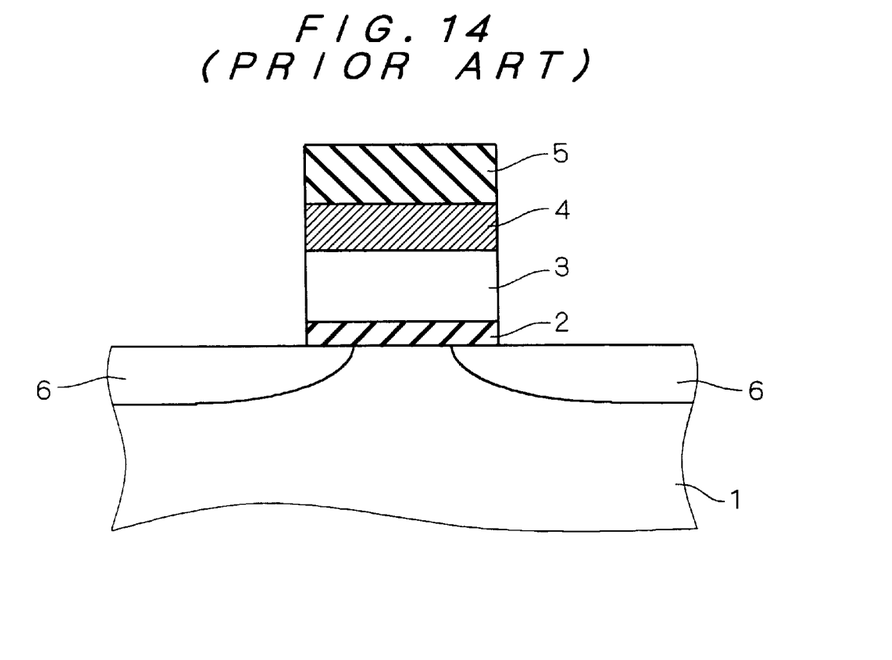

Referring to FIG. 14, masking with the gate oxide film 2, polysilicon 3 and tungsten silicide 4, impurity is implanted to the semiconductor substrate 1, thereby forming a diffused layer 6.

Figure 15:
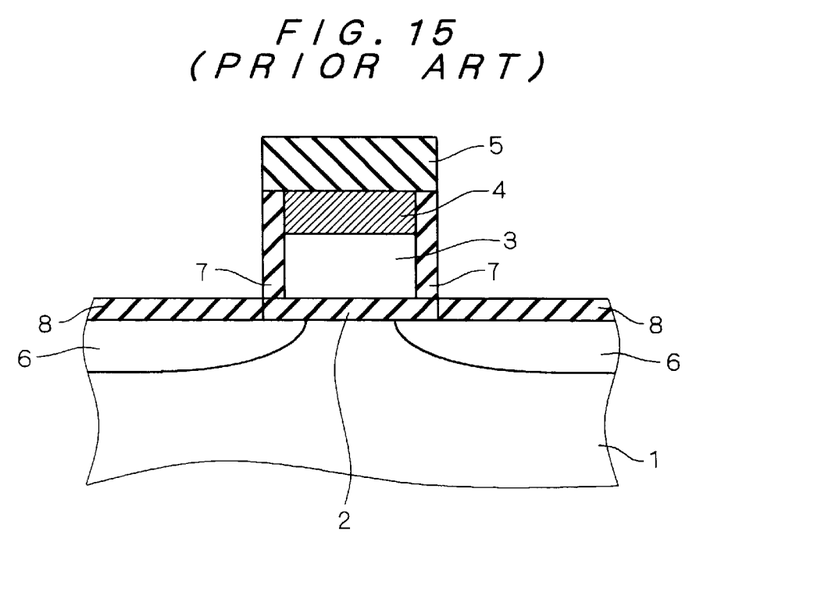

Referring to FIG. 15, the structure of FIG. 14 is oxidized in an atmosphere of 100% oxygen, alternatively, an atmosphere of oxygen which is diluted with an inert gas, such as a nitrogen gas or argon. Thereby, an oxide film 7 is formed on the sidewalls of the polysilicon 3 and tungsten silicide 4, and an oxide film 8 is formed on the surface of the diffused layer 6 of the semiconductor substrate 1.

Figure 16:
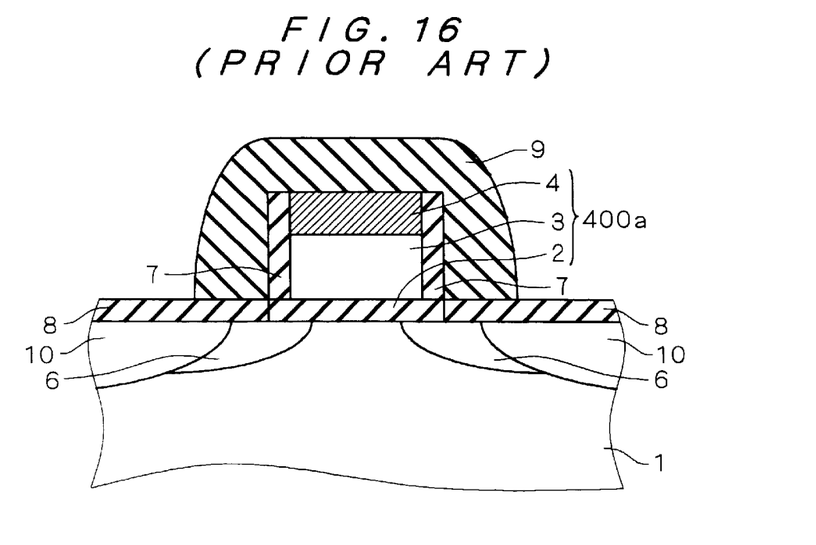

Referring to FIG. 16, a silicon nitride film is deposited on the structure of FIG. 15, following by etching for framing, thereby to leave the silicon nitride film as a sidewall layer 9. Then, implantation for source/drain is conducted to form source/drain region 10.

The resultant MOS transistor is shown in FIG. 16. The polysilicon 3 and tungsten silicide 4 which are part of the gate electrode are referred to as a W (tungsten) polycide structure. The gate oxide film 2, polysilicon 3 and tungsten silicide 4 constitute a gate electrode 400a.

Meanwhile, the tendency toward scale down and high integration is enhanced, and a higher speed operation of circuits is demanded. To satisfy this demand, it has been considered to decrease the resistance of the gate electrode 400a of the MOS transistor.

In order to decrease the resistance of the gate electrode 400a, there are the following two manners: (I) to increase the film thickness of the tungsten silicide 4; and (II) to employ metal, e.g., tungsten (W), which has a lower resistivity than the tungsten silicide 4.

Unfortunately, with the manner (I), the gate electrode 400a is made high and slender in a direction vertically of the semiconductor substrate 1. As a result, it is liable to fall, and there is difficulties encountered in burying an interlayer film between adjacent gate electrodes 400a.

On the other hand, with the manner (II), there is the advantage that it is unnecessary to increase the height of the gate electrode 400a in order to decrease its resistance. However, due to the oxidation for forming the oxide films 7 and 8 in FIG. 15, the oxidation proceeds to the interior of metal, which causes peeling and increases the resistance of the gate electrode 400a.

It can also be considered to omit the oxidation for forming the oxide films 7 and 8, which causes an increase in the resistance of the gate electrode 400a. However, without this oxidation, oxide films 7 and 8 are not formed, so that the sidewall layer 9 and the diffused layer 6 of the semiconductor substrate 1 are brought into contact. When the sidewall layer 9 makes contact with the diffused layer 6, due to the stress applied between the sidewall layer 9 and the diffused layer 6 of the semiconductor substrate 1, a level occurs at the interface, and this level functions as a carrier trap, resulting in poor tolerance to hot carrier. Alternatively, it can be considered to carry out oxidation such that the oxidation does not proceed to the interior of metal. For instance, when oxidation is conducted at a high temperature, 1000° C. in an atmosphere of a mixed gas of hydrogen and oxygen which contains about 5% oxygen, metal is not oxidized, and only the sidewall of the polysilicon 3 and the surface of the semiconductor substrate 1 are oxidized. It is however necessary to add a new equipment for performing such a selective oxidation.

SUMMARY OF THE INVENTION

According to a first aspect of the invention, a method of manufacturing a gate structure comprises the steps of: (a) forming a conductor through a gate insulating film, on a semiconductor substrate; (b) forming a first oxide film on the conductor; (c) oxidizing the sidewall of the conductor; (d) forming a second oxide film so as to cover the first oxide film; (e) performing planarization process from the second oxide film side of the semiconductor substrate, thereby to expose the first oxide film; (f) performing, to the structure obtained by the step (c), an etching process using a vapor phase hydrofluoric acid, thereby to selectively remove the first oxide film; and (g) forming a metal film in the region surrounded by the second oxide film and the conductor.

According to a second aspect, the above method further comprises the step (h), subsequent to the step (d) and prior to the step (e), of forming an insulating film having a lower etching rate than the second oxide film in the planarization process.

According to a third aspect, the first oxide film has an impurity concentration of 2% or more.

With the first aspect, the formation of the metal film in the region from which the first oxide film has been removed, enables to provide a gate structure of a low resistance, and therefore to suppress its height.

With the second aspect, the planarization process in the step (e) can be easily controlled.

With the third aspect, the selective removal of the first oxide film is attainable by the etching process using a vapor phase hydrofluoric acid in the step (f).

An object of the present invention is to provide a method of manufacturing a gate structure which enables to obtain a gate structure of a low resistance without increasing the height of the gate structure, and therefore to suppress its height.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A method of manufacturing a gate structure according to a first preferred embodiment will be described by referring to FIGS. 1 to 8.

Figure 1:
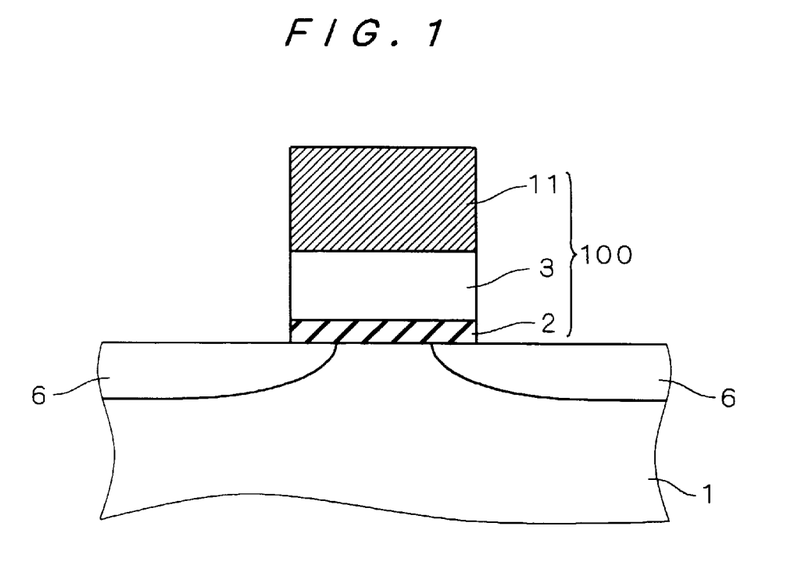
FIGS. 1 to 8 are cross sections illustrating a method of manufacturing a gate structure according to a first preferred embodiment of the invention.

Referring to FIG. 1, a gate oxide film (gate insulator) 2 is formed on a semiconductor substrate 1, in a film thickness of 2 nm to 4 nm, e.g., about 2 nm. Polysilicon (conductor) 3 is formed on the gate oxide film 2, in a film thickness of 50 nm to 150 nm, e.g., about 80 nm.

Subsequently, a TEOS (tetraethylorthosilicate) oxide film (a first oxide film) 11 containing impurity at a predetermined concentration is formed on the polysilicon 3, in a film thickness of about 50 nm to 100 nm, e.g., 70 nm. The impurity implanted to the TEOS oxide film 11 is for example boron (B). The first oxide film 11 is selectively removable by an etching process using a vapor phase HF (hydrofluoric acid). The impurity implanted to the TEOS is, for example, phosphorus (P) or boron (B), and its concentration is 2% or more, for example. Under such a concentration of impurity, the TEOS oxide film 11 is selectively removable by etching using a vapor phase HF, as described later. The polysilicon 3 is disposed for adjusting the work function of the gate (N-polySi for NMOS, and P-polySi for PMOS), in order to obtain an appropriate threshold voltage Vth.

A resist (not shown) is then formed, and the resist is patterned by photolithography technique. By using the resultant resist as a mask, a gate oxide film 2, polysilicon 3, TEOS oxide film 11 are etched away. Thereby, a gate insulator 100 composed of the gate oxide film 2, polysilicon 3 and TEOS oxide film 11 is formed on the semiconductor substrate 1. By using the gate insulator 100 as a mask, impurity is implanted to the semiconductor substrate 1, thereby to form a diffused layer 6. In forming a Nch transistor, for example, As is used as impurity. Its ion implantation is carried out at the acceleration energy of 15 to 30 keV, e.g., 15 keV, and a dosage of about $1\times10^{13}$ to $1\times10^{15}$ cm$^{-2}$, e.g., about $2\times10^{14}$ cm$^{-2}$. In forming a Pch transistor, for example, boron is used as impurity. Its ion implantation is carried out at the acceleration energy of 10 to 30 keV, e.g., 10 keV, and a dosage of about $1\times10^{13}$ to $1\times10^{15}$ cm$^{-2}$, e.g., about $3\times10^{14}$ cm$^{-2}$.

Figure 2:
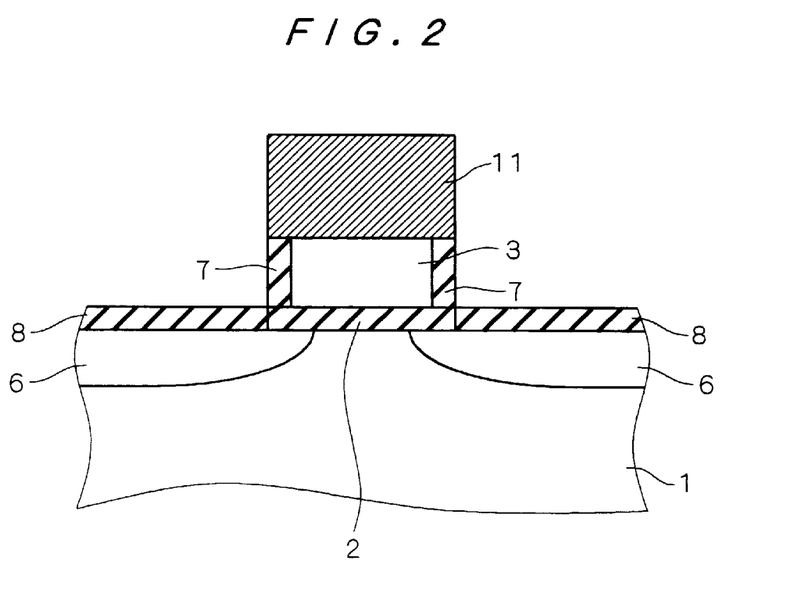

Referring to FIG. 2, the structure of FIG. 1 is oxidized in an atmosphere of 100% oxygen, alternatively, an atmosphere of about 10% oxygen which is diluted with a nitrogen gas. Thereby, an oxide film 8 is formed on the surface of the diffused layer (source/drain region) 6 on both sides of the gate insulator 100 of the semiconductor substrate 1. At this time, the polysilicon 3 is also oxidized, so that an oxide film 7 is formed on the sidewall of the polysilicon 3. When the oxide films 7 and 8 are both from 1 nm to 5 nm in film thickness, e.g., about 2 nm, a tolerance to hot carrier is ensured.

Figure 3:
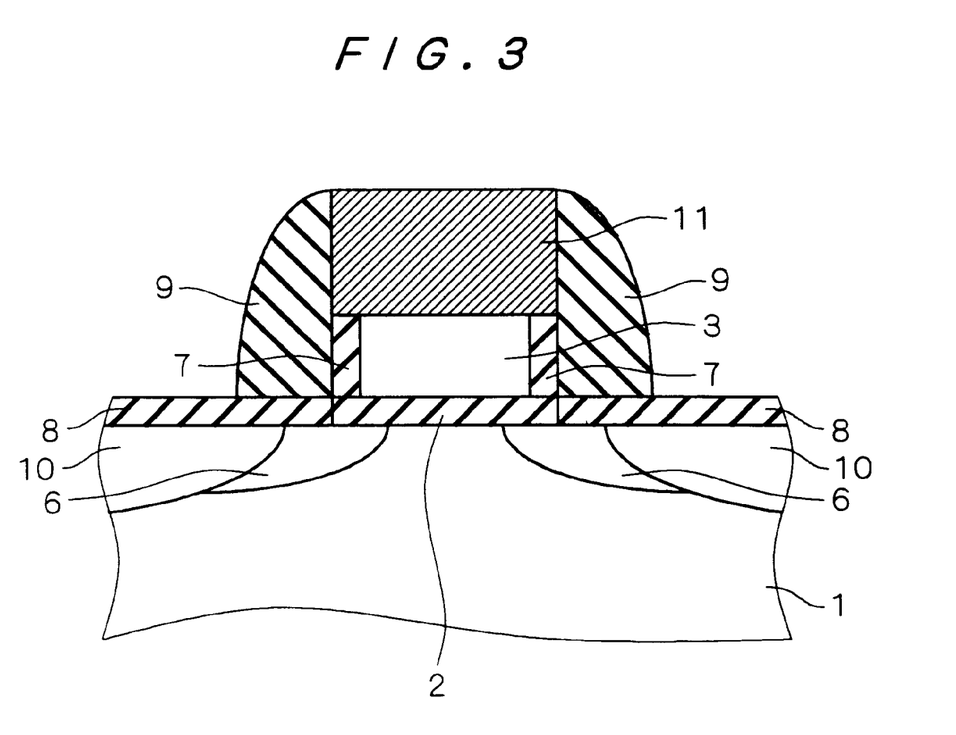

Referring to FIG. 3, a SiN film is deposited on the structure of FIG. 2, in a film thickness of about 70 nm, followed by etching for framing, thereby to leave the SiN film as a sidewall layer 9. Then, by using the sidewall layer 9 as a mask, impurity is implanted to the semiconductor substrate 1, thereby to form source/drain region 10. In forming a Nch transistor, for example, As is used as impurity. Its ion implantation is carried out at the acceleration energy of 60 keV and a dosage of about $1\times10^{15}$ to $6\times10^{15}$ cm$^{-2}$, e.g., about $2\times10^{14}$ cm$^{-2}$. In forming a Pch transistor, for example, boron fluoride (BF$_2$) is used as impurity. Its ion implantation is carried out at the acceleration energy of 30 keV, and a dosage of about $1\times10^{15}$ to $6\times10^{15}$ cm$^{-2}$, e.g., about $1\times10^{15}$ cm$^{-2}$.

Figure 4:
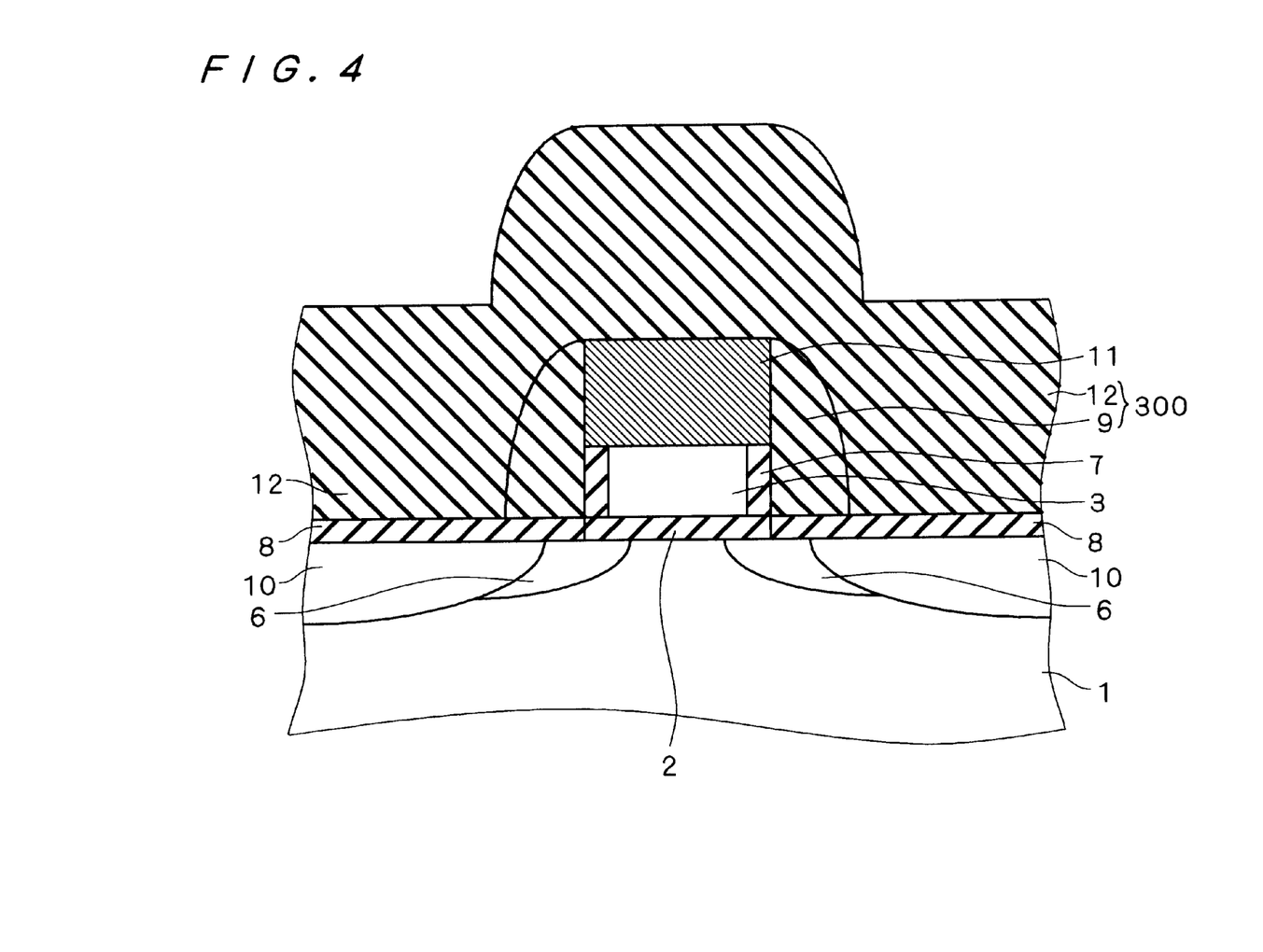

Referring to FIG. 4, a TEOS oxide film (a second oxide film) 12 is deposited on the structure of FIG. 3, in a film thickness of about 200 nm, so as to cover the TEOS oxide film 11 and sidewall layer 9. Unlike the TEOS oxide film 11, the TEOS oxide film 12 does not contain any impurity.

By employing the manufacturing steps as shown in FIGS. 3 and 4, the structure of FIG. 2 is covered with an insulator 300 composed of the sidewall layer 9 and TEOS oxide film 12.

Figure 5:
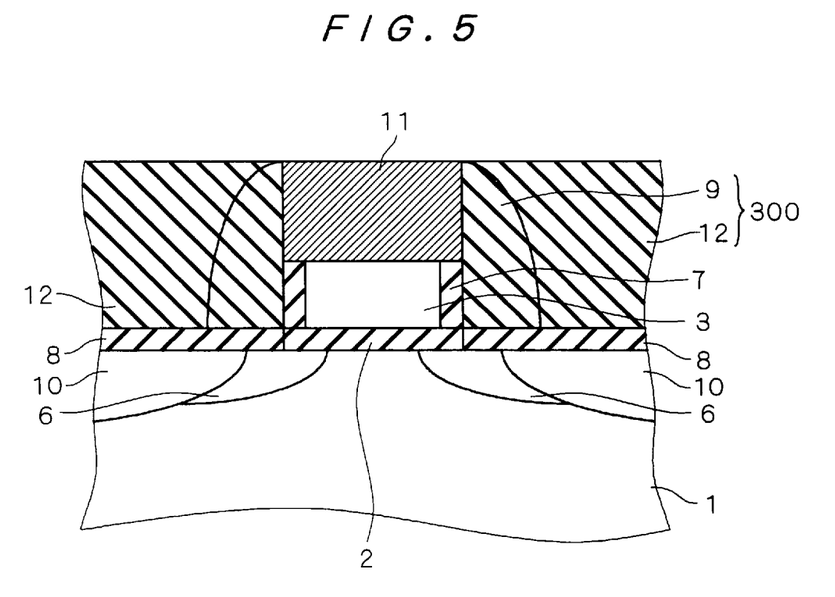

Referring to FIG. 5, CMP (chemical mechanical polishing) as a planarization process is performed from the TEOS oxide film 12 side of the semiconductor substrate 1, thereby to planarize the insulator 300 in FIG. 4. The duration of the CMP is adjusted for exposing the TEOS oxide film 11 present on the top of the gate insulator 100.

Figure 6:
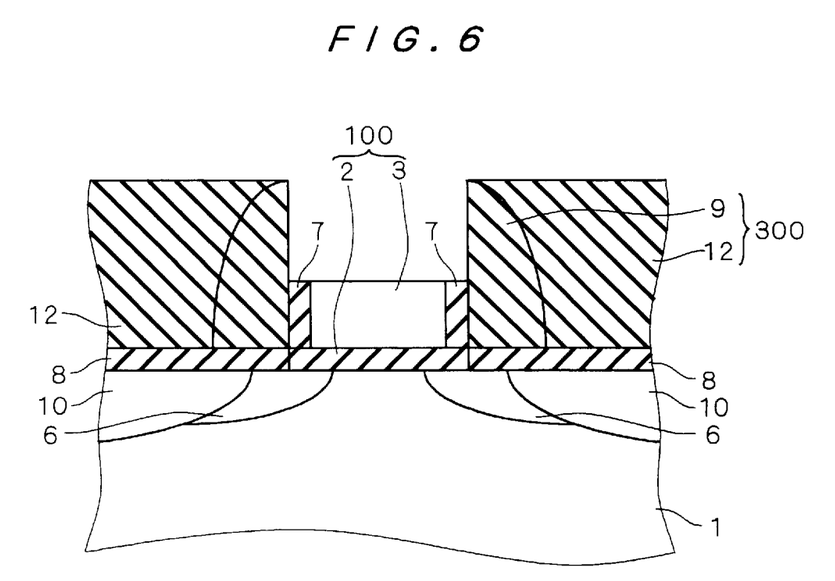

Referring to FIG. 6, etching using a vapor phase HF (hydrofluoric acid) is conducted, thereby to remove the TEOS oxide film 11 containing the impurity. On the other hand, the oxide film 7 on the sidewall of the polysilicon 3 and the TEOS oxide film 12 will not etched away because these are not doped. Also, the sidewall layer 9 remains because it is composed of SiN.

By employing the manufacturing steps as shown in FIGS. 3 to 6, the TEOS oxide film 11 present on the top of the gate insulator 100 is removed.

Figure 7:
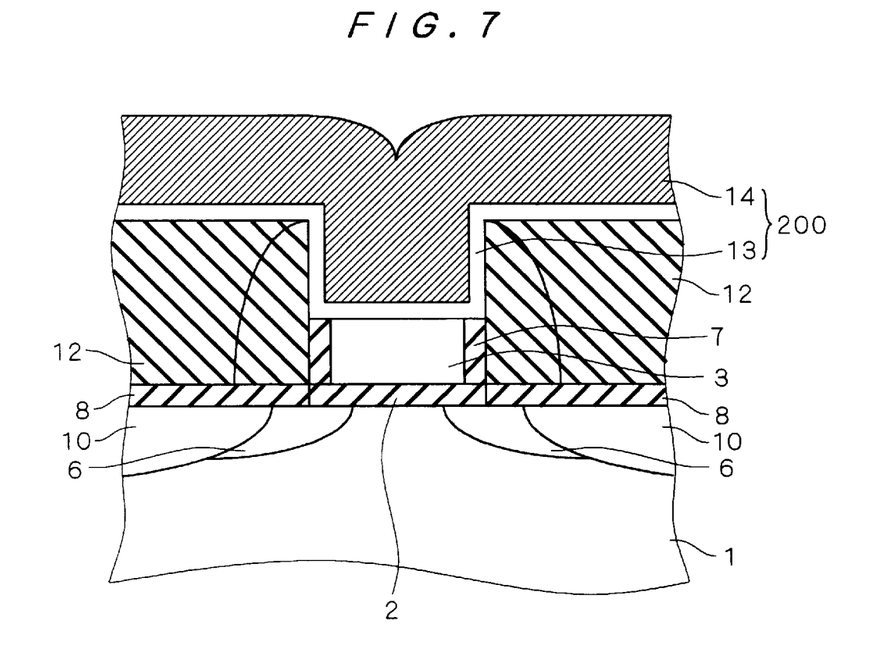

Referring to FIG. 7, a tungsten nitride (WN) 13 is deposited on the structure of FIG. 6, in a film thickness of about 10 nm to 50 nm, and tungsten (W) 14 is deposited thereon in a film thickness of about 50 nm to 150 nm. The tungsten nitride 13 and tungsten 14 constitute metal (a metal film) 200.

Figure 8:
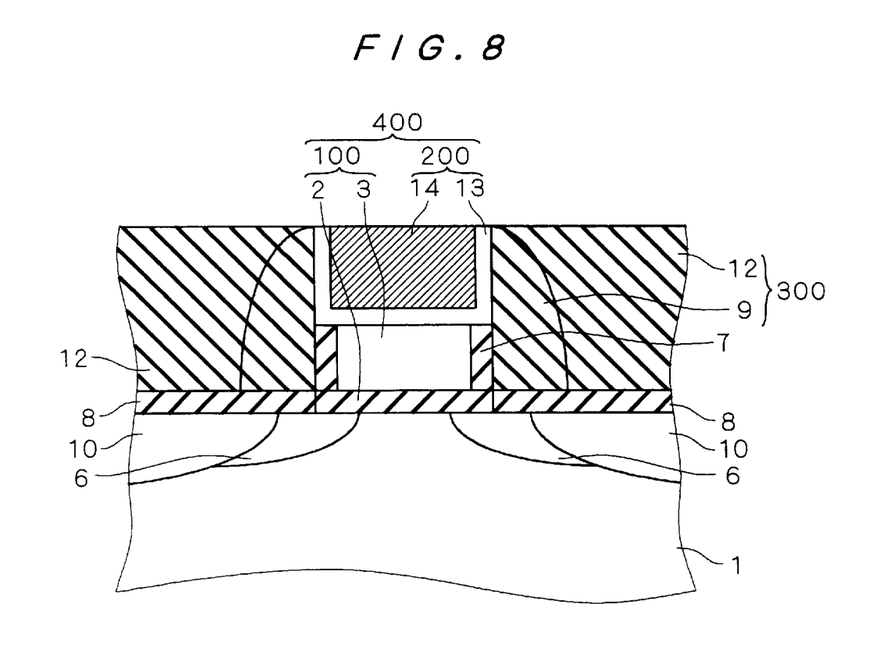

Referring to FIG. 8, CMP as a planarization process is performed from the metal 200 side of the semiconductor substrate 1, thereby to planarize the metal 200 and to expose the TEOS oxide film 12.

By employing the manufacturing steps as shown in FIGS. 7 and 8, the metal 200 composed of the tungsten nitride 13 and tungsten 14 is buried in the region surrounded by the gate insulator 100 and insulating film 300.

Thus, by forming, the metal 200 on the gate insulator 100 from which the TeOS oxide film 11 has bee n removed, a gate electrode 400 is obtained which is composed of the gate insulator 100 and metal 200, thus completing a MOS transistor. The polysilicon 3 and metal 200 which are part of the gate electrode 400 are referred to as a polymetal gate structure. The insulating film 300 covering the surface of the semiconductor substrate 1 and the sidewall of the gate electrode 400 is utilized as an interlayer insulating film.

By virtue of the feature that the gate electrode 400 is composed of the metal 200 having a lower resistivity than the tungsten silicide 4 (see FIG. 16), it will now be possible to decrease the resistance of the gate electrode 400 than with heretofore conventional ones.

In addition, the metal 200 is not oxidized because the oxidation for forming the oxide film 8 is performed before forming the metal 200. This avoids peeling of the metal 200 from the gate insulator 100, and an increase in the resistance of the gate electrode 400. Further, the oxide film 8 disposed between the sidewall layer 9 and the diffused layer 6 of the semiconductor substrate 1, functions to relax the stress applied therebetween. Therefore, a level functioning as a carrier trap is less liable to occur at the interface, and thus a tolerance to hot carrier is less susceptible of deterioration.

The use of the metal 200 in forming the gate electrode 400 enables to decrease the resistance of the gate electrode 400, without increasing it s height. Further, with the manner that the gate electrode 400 is made low by removing the top of the gate insulator 100 (the TEOS oxide film 11 in FIGS. 3 to 6) before the metal 200 is formed on the gate insulator 100, it is possible to extremely decrease the height of the gate electrode 400, without increasing its resistance. This prevents any tendency of the gate electrode 400 to fall, and difficulties in burying an interlayer film between adjacent gate electrodes 400.

Referring again to FIGS. 3 to 8, the insulating film 300 surrounding the TEOS oxide film 11 present on the top of the gate insulator 100, can be utilized as a frame, thereby to replace with the metal 200. The insulating film 300 is also utilizable as an interlayer insulating film.

Only the sidewall of the polysilicon 3 and the surface of the semiconductor substrate 1 can be oxidized without consideration of oxidation of the metal 200. Therefore, it is unnecessary to add a new equipment for performing such a selective oxidation as described earlier in the prior art.

Accordingly, with the first preferred embodiment, the formation of the metal 200 in the region from which the TEOS oxide film 11 has been removed, enables to obtain a gate structure of a low resistance, and therefore to suppress its height.

Second Preferred Embodiment

Referring to FIG. 7, a second preferred embodiment is similar to the first preferred embodiment except that the tungsten nitride 13 is replaced with tantalum nitride (TaN), and the tungsten 14 is replaced with copper (Cu). In addition to similar effects to the foregoing embodiment, this embodiment achieves a further decrease in the resistance of the gate electrode 400, because the resistivity of copper is one half that of tungsten.

Third Preferred Embodiment

Referring to FIG. 1, a third preferred embodiment is similar to the first preferred embodiment except that instead of boron, phosphorus is implanted to the TEOS oxide film 11. The resultant TEOS oxide film 11 has the same hygroscopicity as the TEOS oxide film containing boron, and it is selectively removable by a vapor phase HF.

Alternatively, both phosphorus and boron may be implanted to the TEOS oxide film 11. This produces the same effects.

Fourth Preferred Embodiment

A method of manufacturing a gate structure according to a fourth preferred embodiment will be described by referring to FIGS. 9 and 10.

The structure of FIG. 4 is obtained in the same manner as the first preferred embodiment. Referring to FIG. 9, the insulating film 300 in FIG. 4 is covered with a silicon nitride film (SiN) 18 (an insulating film that functions as a stopper) which has an etching rate in CMP being lower than the insulating film 300. Hereat, the film thickness of a TEOS oxide film 12 is about 150 nm, and that of the silicon nitride film 18 is about 20 nm, for example.

Figure 10:
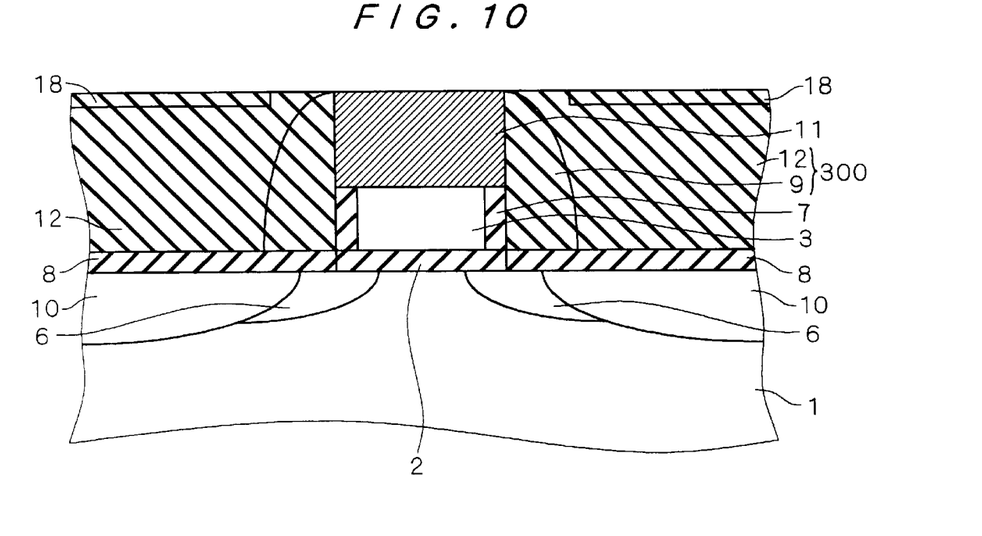

Referring to FIG. 10, as described with respect to FIG. 5, CMP as a planarization process is performed from the silicon nitride film 18 side of the semiconductor substrate 1, thereby to planarize the insulating film 300 and silicon nitride film 18, and to expose the TEOS oxide film 11 present on the top of the gate insulator 100.

The subsequent steps are the same as described in FIGS. 6 to 8.

Figure 9:
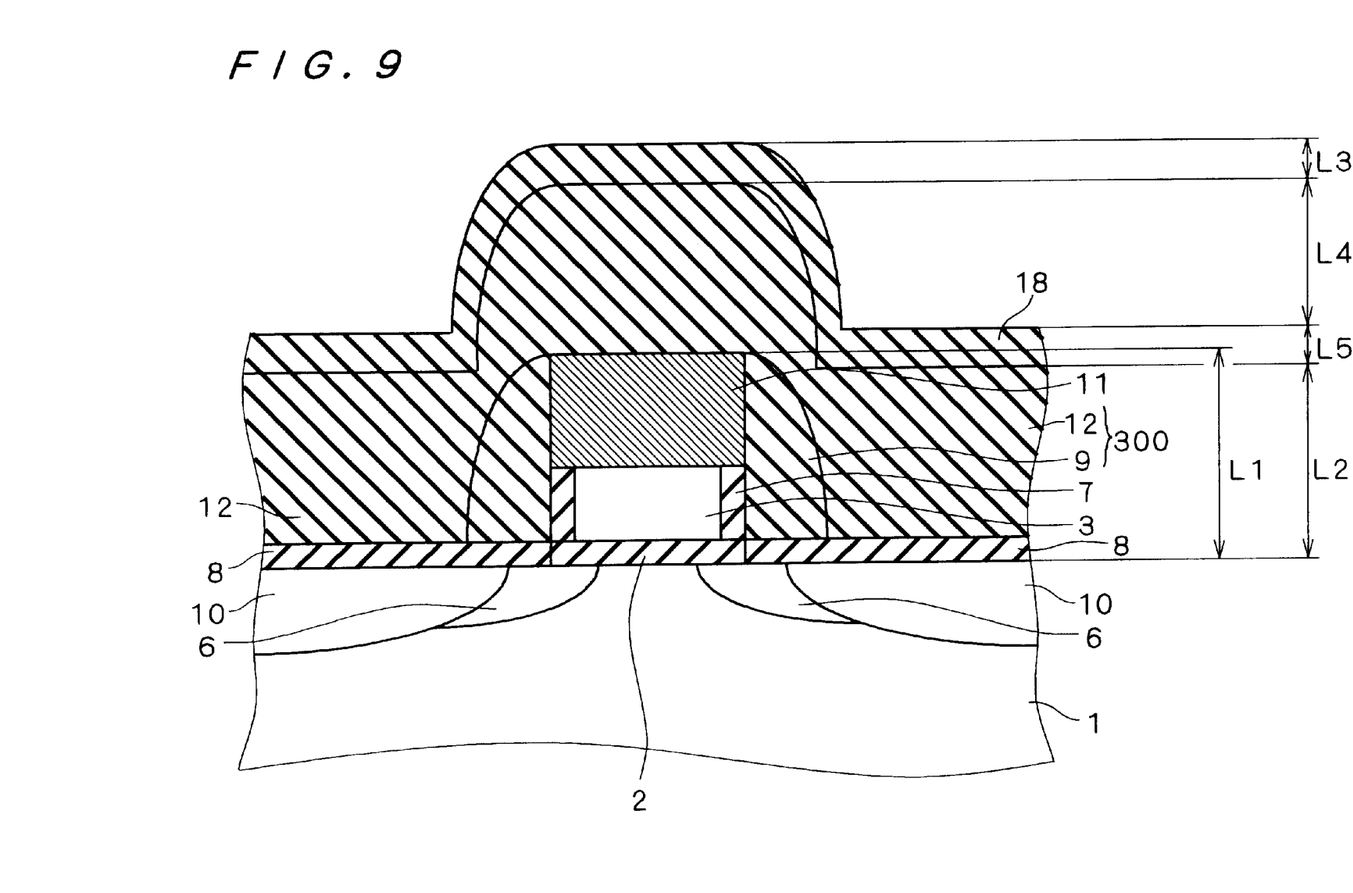
FIGS. 9 and 10 are cross sections illustrating a method of manufacturing a gate structure according to a fourth preferred embodiment.

As to the structure of FIG. 9, distance L1 from the upper surface of source/drain region 10 to the upper surface of the TEOS oxide film 11, is shorter than distance L2 from the upper surface of the source/drain region 10 to the boundary between the TEOS oxide film 12 and the silicon nitride film 18. The silicon nitride film 18 is less liable to be polished by CMP, than the TEOS oxide film 12. Region L3 designates the region extending from the top of the silicon nitride film 18 to the boundary between the silicon nitride film 18 and the TEOS oxide film 12. Region L4 designates the region extending from the boundary between the silicon nitride film 18 and the TEOS oxide film 12 to the main surface of the silicon nitride film 18. Region L5 designates the region extending from the main surface of the silicon nitride film 18 to the boundary between the silicon nitride film 18 present on its main surface and the TEOS oxide film 12.

With this construction, the region L5 is most less liable to be polished because the regions L3 and L4 contain the silicon nitride film 18 in a large amount. It is therefore easier to control the duration of the CMP for exposing the TEOS oxide film 11, than the first preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a gate structure comprising the steps of:
    (a) forming a conductor through a gate insulating film, on a semiconductor substrate; said conductor being composed mainly of a semiconductor;
    (b) forming a first oxide film on said conductor;
    (c) oxidizing the side of said conductor;
    (d) forming a second oxide film so as to cover said first oxide film; said second oxide film being an oxide film of a semiconductor; and said first oxide film has a higher impurity concentration than an oxidized side of said conductor and said second oxide film
    (e) performing a CMP planarization process from said second oxide film side of said semiconductor substrate, thereby to expose said first oxide film;
    (f) performing, to the structure obtained by said step (e), an etching process using a vapor phase hydrofluoric acid, thereby to selectively remove said first oxide film; and
    (g) forming a metal film in the region surrounded by said second oxide film and said conductor.

2. The method of manufacturing a gate structure according to claim 1 further comprising a step, prior to said step (d), of forming an insulative sidewall so as to cover a side of said first oxide film and an oxidized side of said conductor.

3. The method of manufacturing a gate structure according to claim 2 wherein in said step (d) said second oxide film is formed so as to cover said insulative sidewall.

4. The method of manufacturing a gate structure according to claim 1 wherein said first oxide film has an impurity concentration of 2% or more.

5. The method of manufacturing a gate structure according to claim 1 further comprising a step, prior to said step (g), of oxidizing the surface of said semiconductor substrate.

6. The method of manufacturing a gate structure according to claim 1 wherein said step (g) has the steps of:
- (g-1) forming said metal film so as to fill the region surrounded by said second oxide film and said conductor; and
- (g-2) performing a CMP planarization process to the structure obtained in said step (g-1), thereby to expose said second oxide film.

7. The method of manufacturing a gate structure according to claim 1 wherein said metal film constitutes a two-layer structure.

8. The method of manufacturing a gate structure according to claim 1 further comprising a step, subsequent to said step (d) and prior to said step (e), of forming an insulating film having a lower etching rate than said second oxide film in said planarization process, on said second oxide film.

9. The method of manufacturing a gate structure according to claim 8 wherein said insulating film is a nitride film.

10. The method of manufacturing a gate structure according to claim 9 wherein said planarization process is effected by CMP process.

11. A method of manufacturing a gate structure comprising the steps of:
- (a) forming a conductor through a gate insulating film, on a semiconductor substrate;
- (b) forming a first oxide film on said conductor;
- (c) oxidizing the side of said conductor;
- (d) forming a second oxide film so as to cover said first oxide film;
- (e) forming an insulating film having a lower etching rate than said second oxide film in a CMP planarization process, on said second oxide film;
- (f) performing a CMP planarization process from said second oxide film side of said semiconductor substrate, thereby to expose said first oxide film;
- (g) performing, to the structure obtained by said step (f), an etching process using a vapor phase hydrofluoric acid, thereby to selectively remove said first oxide film; and
- (h) forming a metal film in the region surrounded by said second oxide film and said conductor.

12. The method of manufacturing a gate structure according to claim 11, further comprising a step, prior to said step (d), of forming an insulative sidewall so as to cover a side of said first oxide film and an oxidized side of said conductor.

13. The method of manufacturing a gate structure according to claim 12, wherein in said step (d) said second oxide film is formed so as to cover said insulative sidewall.

14. The method of manufacturing a gate structure according to claim 12 wherein said first oxide film has an impurity concentration of 2% or more.

15. The method of manufacturing a gate structure according to claim 11, wherein said conductor is composed mainly of a semiconductor;
- said second oxide film is an oxide film of a semiconductor; and
- said first oxide film has a higher impurity concentration than an oxidized side of said conductor and said second oxide film.

16. The method of manufacturing a gate structure according to claim 11 further comprising a step, prior to said step (h), of oxidizing the surface of said semiconductor substrate.

17. The method of manufacturing a gate structure according to claim 11 wherein said step (h) has the steps of:
- (h-1) forming said metal film so as to fill the region surrounded by said second oxide film and said conductor; and
- (h-2) performing a CMP planarization process to the structure obtained in said step (h-1), thereby to expose said second oxide film.

18. The method of manufacturing a gate structure according to claim 11 wherein said metal film constitutes a two-layer structure.

19. The method of manufacturing a gate structure according to claim 11 wherein said insulating film is a nitride film.

20. The method of manufacturing a gate structure according to claim 11 wherein said planarization process is effected by CMP process.

* * * * *